United States Patent
Tsushima

(10) Patent No.: US 7,657,429 B2
(45) Date of Patent: Feb. 2, 2010

(54) CODING APPARATUS AND CODING METHOD FOR CODING WITH REFERENCE TO A CODEBOOK

(75) Inventor: Mineo Tsushima, Nara (JP)

(73) Assignee: Panasonic Corporation, Osaka (JP)

( * ) Notice: Subject to any disclaimer, the term of this patent is extended or adjusted under 35 U.S.C. 154(b) by 811 days.

(21) Appl. No.: 10/557,149

(22) PCT Filed: Jun. 7, 2004

(86) PCT No.: PCT/JP2004/008258

§ 371 (c)(1), (2), (4) Date: Nov. 17, 2005

(87) PCT Pub. No.: WO2004/112400

PCT Pub. Date: Dec. 23, 2004

(65) Prior Publication Data

US 2006/0245489 A1   Nov. 2, 2006

(30) Foreign Application Priority Data

Jun. 16, 2003   (JP) .............................. 2003-170287

(51) Int. Cl.
*G10L 19/14* (2006.01)
*H03M 7/42* (2006.01)

(52) U.S. Cl. ...................... 704/230; 341/67; 341/106; 341/200

(58) Field of Classification Search ............. 704/200.1, 704/221, 229, 230, 500, 501; 341/51, 65, 341/106, 107, 200, 67

See application file for complete search history.

(56) References Cited

U.S. PATENT DOCUMENTS

| | | | | |
|---|---|---|---|---|
| 5,408,234 A * | 4/1995 | Chu | ............................ | 341/106 |
| 5,535,300 A * | 7/1996 | Hall et al. | .................... | 704/227 |
| 5,794,179 A * | 8/1998 | Yamabe | ...................... | 704/205 |
| 5,818,877 A * | 10/1998 | Tsai et al. | .................... | 375/241 |
| 5,956,674 A * | 9/1999 | Smyth et al. | .............. | 704/200.1 |
| 6,157,328 A * | 12/2000 | Lu et al. | ........................ | 341/67 |
| 6,295,009 B1 * | 9/2001 | Goto | ........................... | 341/50 |
| 6,441,755 B1 * | 8/2002 | Dietz et al. | ................... | 341/50 |

(Continued)

FOREIGN PATENT DOCUMENTS

EP   1 195 993   4/2002

(Continued)

OTHER PUBLICATIONS

M. Bosi et al., IS 13818-7 (MPEG-2 Advanced Audio Coding, AAC), Apr. 1997, pp. 1, 51-56 and 93-95.

(Continued)

*Primary Examiner*—Martin Lerner
(74) *Attorney, Agent, or Firm*—Wenderoth, Lind & Ponack, L.L.P.

(57) ABSTRACT

A coding apparatus includes a fourth layer codebook that shows N number of codes indicating uniquely respective N integers that increment one by one; and first to third layer codebooks that show M number of codes indicating uniquely respective M integers that are a subset of the N integers, and codes a digital signal using any one of the first to fourth layer codebooks. The coding apparatus does not need to do rescaling even when switching one of the first to fourth layer codebooks into another of them.

14 Claims, 13 Drawing Sheets

U.S. PATENT DOCUMENTS

| | | | |
|---|---|---|---|
| 6,446,037 B1 * | 9/2002 | Fielder et al. | 704/229 |
| 6,484,142 B1 * | 11/2002 | Miyasaka et al. | 704/500 |
| 6,593,872 B2 * | 7/2003 | Makino et al. | 341/200 |
| 6,678,653 B1 * | 1/2004 | Tsushima et al. | 704/220 |
| 6,717,534 B2 * | 4/2004 | Yokose | 341/65 |
| 6,891,482 B2 * | 5/2005 | Craven et al. | 341/50 |
| 6,919,828 B2 * | 7/2005 | Jeon et al. | 341/67 |
| 7,426,462 B2 * | 9/2008 | Young et al. | 704/200.1 |
| 7,469,011 B2 * | 12/2008 | Lin et al. | 375/240.23 |
| 2002/0120442 A1 * | 8/2002 | Hotta | 704/229 |
| 2002/0122481 A1 | 9/2002 | Mine | |

FOREIGN PATENT DOCUMENTS

| | | |
|---|---|---|
| JP | 4-245719 | 9/1992 |
| JP | 7-274171 | 10/1995 |
| JP | 2002-311997 | 10/2002 |

OTHER PUBLICATIONS

H. Wang, et al, "Coding Technology of MPEG-2 AAC and Implementation of Its Software Decoder," Computer Engineering, vol. 27, No. 6, Jun. 2001, pp. 51-53 (with English translation of Section 1.2: Decoding Process of AAC, which was referred to in Chinese Office Action).

E. Kofidis et al., "Wavelet-based medical image compression", Future Generations Computer Systems, Elsevier Science Publishers, Amsterdam, NL, vol. 15, No. 2, Mar. 11, 1999, XP004222991, pp. 223-243.

D. Taubman et al., "Highly scalable, low-delay video compression", Proceedings of the International Conference on Image Processing (ICIP), Austin, Nov. 13-16, 1994, Los Alamitos, IEEE Comp.soc. press, US, vol. 3, Conf.1, Nov. 13, 1994, XP010145998, pp. 740-744.

S. R. Quackenbush et al., "Noiseless coding of quantized spectral components in MPEG-2 advanced audio coding", Applications of Signal Processing to Audio and Acoustics, 1997, 1997 IEEE ASSP Workshop on New Paltz, NY, USA Oct. 19-22, 1997, New York, NY, USA, IEEE, US, Oct. 19, 1997, XP010248193, pp. 1-4.

* cited by examiner

PRIOR ART

FIG. 2

| Quantized value | Code |
|---|---|
| 1 | 111 |
| 0 | 100 |
| -1 | 0 |

201

| Quantized value | Code |
|---|---|
| 2 | 1010 |
| 1 | 100 |
| 0 | 00 |
| -1 | 01 |
| -2 | 1011 |

202

| Quantized value | Code |
|---|---|
| 3 | 10101 |
| 2 | 10100 |
| 1 | 100 |
| 0 | 00 |
| -1 | 01 |
| -2 | 10110 |
| -3 | 10111 |

203

| Quantized value | Code |
|---|---|
| 4 | 1010001 |
| 3 | 10101 |
| 2 | 1010000 |
| 1 | 100 |
| 0 | 00 |
| -1 | 01 |
| -2 | 10110 |
| -3 | 10111 |
| -4 | 1010010 |

204

PRIOR ART

PRIOR ART

FIG. 9

| Quantized value | Code |
|---|---|
| 4 | 111 |
| 2 | 100 |
| 0 | 0 |

901

| Quantized value | Code |
|---|---|
| 4 | 1010 |
| 2 | 100 |
| 1 | 00 |
| 0 | 01 |
| -4 | 1011 |

902

| Quantized value | Code |
|---|---|
| 4 | 10101 |
| 2 | 10100 |
| 1 | 100 |
| 0 | 00 |
| -1 | 01 |
| -3 | 10110 |
| -4 | 10111 |

903

| Quantized value | Code |
|---|---|
| 4 | 1010001 |
| 3 | 10101 |
| 2 | 1010000 |
| 1 | 100 |
| 0 | 00 |
| -1 | 01 |
| -2 | 10110 |
| -3 | 10111 |
| -4 | 1010010 |

904

US 7,657,429 B2

CODING APPARATUS AND CODING METHOD FOR CODING WITH REFERENCE TO A CODEBOOK

TECHNICAL FIELD

The present invention relates to a coding apparatus and a coding method for coding audio signals and video signals efficiently, and codebooks used for the coding.

BACKGROUND ART

Efficient variable-length coding methods, as typified by the Huffman coding method, have been adopted for coding audio signals and video signals. For example, an international standard, ISO/IEC 13818-7, commonly called MPEG-2 AAC (Moving Picture Coding Experts Group-2, Advanced Audio Coding) or the like is renowned as a coding method of audio signals. In this coding method, a plurality of Huffman coding methods are used because their coding efficiency is extremely high.

In the case of AAC, in order to achieve compression of data amount, MDCT (Modified Discrete Cosine Transform) coefficients are scaled and quantized into integers, and then the quantized coefficients are represented as Huffman codes. Here, in the AAC Huffman coding, the Huffman codes are assigned to all the integers, as the representative points for quantization, within a range between the determined maximum and minimum values of the quantized integers. The assignment of the Huffman codes like this means representation of the distance between certain maximum and minimum values, as an Euclidean distance, by equally spaced representative points. As a result, it is possible to control quantization errors only in each space, without fail, regardless of the distribution of the objects to be quantized. In addition, the use of a plurality of Huffman codebooks of various quantization resolutions gives the choice between less bit consumption for more quantization errors and more bit consumption for less quantization errors.

FIG. 1 is a diagram showing a configuration of a coding apparatus 100 for coding audio signals by the conventional AAC method. The coding apparatus 100 includes a scaling unit 101, a quantization unit 102, a code generation unit 103, a codebook holding unit 104 and a stream generation unit 105. A digital audio signal in the time domain obtained by sampling an analog audio signal at a fixed frequency is split, at a regular time interval, into groups of a fixed number of samples, transformed via MDCT into MDCT coefficients that are data in the frequency domain, and then inputted, as an input digital signal Y, into the coding apparatus 100. The input digital signal Y is inputted to the scaling unit 101, which scales the MDCT coefficients included in each frequency band called a scale factor band, with one certain gain A for each scale factor band. The scaling unit 101 outputs the scaling gain A to the stream generation unit 105, and outputs the MDCT coefficients X obtained as a result of the scaling to the quantization unit 102. The quantization unit 102 quantizes the scaled MDCT coefficients X using a predetermined conversion formula. To be more specific, in the case of the AAC method, rounding off the MDCT coefficient which is expressed as a floating point into an integer value is the quantization thereof. The code generation unit 103 codes the quantized MDCT coefficients with reference to a codebook stored in the codebook holding unit 104, and outputs the codes C thereof to the stream generation unit 105. The stream generation unit 105 adds header information and the like to the gain A inputted from the scaling unit 101 and the codes C within the scale factor band inputted from the code generation unit 103, and outputs them as a stream. In the codebook holding unit 104, a plurality of codebooks of various quantization resolutions are stored. If coding is performed with reference to the codebook of lower quantization resolution, among the codebooks stored in the codebook holding unit 104, the bit amount of the stream can be reduced in return for more quantization errors. On the contrary, if coding is performed with reference to the codebook of higher quantization resolution, the quantization errors can be reduced in return for more bit amount of the stream. In sum, the coding apparatus 100 enhances the coding efficiency by selecting the codebook suitable for the coding from among the codebooks of various quantization resolutions.

FIG. 2 is a diagram showing an example of codebooks 201 to 204 of various quantization resolutions stored in the codebook holding unit 104 of the conventional coding apparatus 100 as shown in FIG. 1. In the codebook 201, quantized values can be any of the integers "−1", "0" and "1" between the maximum value "1" and the minimum value "−1", and the codes for the quantized values are represented as binary values using 0 and 1. In the codebook 202, quantized values can be any of the integers "−2", "−1", "0", "1" and "2" between the maximum value "2" and the minimum value "−2", and the codes for the quantized values are represented as binary values using 0 and 1. In the codebook 203, quantized values can be any of the integers "−3", "−2", "−1", "0", "1", "2" and "3" between the maximum value "3" and the minimum value "−3", and the codes for the quantized values are represented as binary values using 0 and 1. In the codebook 204, quantized values can be any of the integers "−4", "−3", "−2", "−1", "0", "1", "2", "3" and "4" between the maximum value "4" and the minimum value "−4", and the codes for the quantized values are represented as binary values using 0 and 1. These codes are just examples, and the present invention is not limited to them.

FIG. 3 shows distributions of representative points (quantized values X') for quantization of objects to be quantized X with reference to each of the codebooks in FIG. 2, namely, sets of integers that are representative points. As shown in FIG. 2 and FIG. 3, the codebook 201 shows that the codes are assigned to three representative points "1", "0" and "−1". In this case, the MDCT coefficients that are the objects to be quantized $X_1$ are scaled so as to be values around between the maximum value "1" and the minimum value "−1" (but not limited to those values). As mentioned above, the codes require only three values for representing respective representative points in the case where coding is performed with reference to the codebook 201, so only a small number of bits are needed. The codebook 202 shows that the codes are assigned to five representative points "2", "1", "0", "−1" and "−2" as quantized values $X_2'$. In this case, the MDCT coefficients that are the objects to be quantized $X_2$ are scaled so as to be values around between the maximum value "2" and the minimum value "−2" (but not limited to those values). As mentioned above, in the case where coding is performed with reference to the codebook 202, the codes of a larger number of bits are needed for representing five quantized values $X_2'$ than the case where three quantized values $X_1'$ are represented in the codebook 201. Similarly, in the case where coding is performed with reference to the codebook 203, the codes are assigned to seven quantized values $X_3'$ from "−3" to "+3", and the MDCT coefficients that are the objects to be quantized $X_3$ are scaled so as to be values around between the maximum value "3" and the minimum value "−3". In the case where coding is performed with reference to the codebook 204, the codes are assigned to nine quantized values $X_4'$ from "−4" to "+4", and the MDCT coefficients that are the objects to be quantized $X_4$ are scaled so as to be values around between the maximum value "4" and the minimum value "−4". In the case of the AAC as an audio coding method, quantization and coding are performed using the method as mentioned above.

In addition, as shown in FIG. 2, the codebooks 201 to 204 are designed so that the codes of shorter bit patterns are assigned to frequently appearing quantized values.

However, in the conventional method, the objects to be quantized are just quantized into representative points which are equally spaced in both plus and minus directions from 0 as a center, regardless of the actual distribution of the objects. For example, as is obvious from FIG. 3, the representative points 301 to 304 that correspond to the codebooks 201 to 204 are distributed at equal spaces in the plus and minus directions from 0 as a center. It is statistically common that the objects to be quantized are distributed at equal spaces, but it is rather difficult to say that they are always equally spaced from 0 as a center and never be biased toward either plus or minus direction.

Furthermore, in the above conventional method, objects to be quantized are quantized using a plurality of Huffman codebooks of various quantization resolutions for improvement of coding efficiency. However, when a codebook is switched into another codebook of another quantization resolution, the objects to be quantized need to be rescaled for adopting them to the resolution of the other codebook. FIG. 4 is a flowchart showing an example of the procedures of the coding processing in the case where the conventional coding apparatus 100 performs coding using codebooks of various quantization resolutions. Here, the case where coding is performed first with reference to the codebook of the highest quantization resolution will be explained as an example of the coding method. It is assumed, in this case, that coding is performed with reference to a codebook of the one-level lower quantization resolution when the number of bits in a scale factor band exceeds a reference value as a result of the coding using the codebook of the highest quantization resolution, and then such coding is repeated until the number of bits in the scale factor band becomes the reference value or less or there is no more codebooks of the lower quantization resolution. First, "N" number of (where N is a natural number) MDCT coefficients ($y_1, y_2, y_3, \ldots, y_N$) in each scale factor band are inputted into the scaling unit 101 (S401). The scaling unit 101 scales the inputted MDCT coefficients so that the values thereof fall within a range of representative points in the codebook of the highest quantization resolution (S402). For example, in the case where coding is performed with reference to the codebook 204, the scaling unit 101 scales the "k"th MDCT coefficients $y_k$ with a gain A when an equation $-4 < (y_k/A) = x_k < +4$ holds for all these MDCT coefficients, where $k=1, 2, \ldots, n$. The quantization unit 102 rounds off the scaled MDCT coefficients $x_k$, and the code generation unit 103 reads out, from the codebook 204, the codes $C_k$ which are to be assigned to the quantized values $x_k'$ obtained by the rounding-off. The code generation unit 103 calculates the total number of bits of N codes ($C_1, C_2, C_3, \ldots, C_N$) in the scale factor band (S403), and judges whether or not the calculated total number of bits is the target number of bits or less (S404).

When the total number of bits of the codes in the scale factor band is the target number of bits or less in Step S404 (YES in S404), the code generation unit 103 outputs, to the stream generation unit 105, the ID (or the number or the like) of the codebook used for coding the scale factor band and the codes ($C_1, C_2, C_3, \ldots, C_N$) in the scale factor band. The stream generation unit 105 outputs a stream including: the ID of the codebook and the codes ($C_1, C_2, C_3, \ldots, C_N$) in the scale factor band which are outputted from the code generation unit 103; and the scaling gain A which is outputted from the scaling unit 101 (S405). The MDCT coefficients in the next scale factor band are inputted to the coding apparatus 100, which starts the above-mentioned processing from Step S401.

When the total number of bits of the N codes ($C_1, C_2, C_3, \ldots, C_N$) in the scale factor band is larger than the target number of bits in Step S404 (NO in S404), the code generation unit 103 instructs the scaling unit 101 to rescale the MDCT coefficients ($y_1, y_2, y_3, \ldots, y_N$) in the same scale factor band so that the values thereof fall within a range of values of representative points in the codebook of the one-level lower quantization resolution. According to this instruction, the scaling unit 101 returns to the processing in Step S402 and rescales the coefficients (S402). To be more specific, for the purpose of coding with reference to the codebook 203 of the one-level lower quantization resolution than the codebook 204, the scaling unit 101 scales the "k"th MDCT coefficients $y_k$ with a gain A when an equation $-3 < (y_k/A) = x_k < +3$ holds for all these MDCT coefficients, where $k=1, 2, \ldots, n$. The quantization unit 102 rounds off the scaled MDCT coefficients $x_k$, and the code generation unit 103 reads out, from the codebook 203, the codes $C_k$ which are to be assigned to the quantized values $x_k'$ obtained by the rounding-off. The code generation unit 103 calculates the total number of bits of N codes ($C_1, C_2, C_3, \ldots, C_N$) in the scale factor band (S403), and judges whether or not the calculated total number of bits is the target number of bits or less (S404). In the case where the total number of bits of the N codes ($C_1, C_2, C_3, \ldots, C_N$) in the scale factor band is still larger than the target number of bits at this time, the coding apparatus 100 returns to the processing in Step S402, modifies the value of the gain A, and repeats the processing in Steps S402 to S404 until there is no more codebooks of the lower quantization resolution or the total number of bits in the scale factor band becomes the target number of bits or less.

As described above, for the sake of rescaling, not only division needs to be carried out for N number of MDCT coefficients included in each scale factor band, but also each of the real number values of the N number of MDCT coefficients needs to be compared with a range of values of representative points. These division and comparison require an enormous amount of calculations, which causes a problem in coding.

Against the backdrop as mentioned above, an object of the present invention is to provide a coding apparatus that allow more efficient coding without increase in processing load due to rescaling and a decoding apparatus.

SUMMARY OF THE INVENTION

In order to solve this problem, the coding apparatus according to the present invention is a coding apparatus for coding a digital signal with reference to a codebook, comprising: a holding unit operable to hold a first codebook and at least one second codebook; and a coding unit operable to replace a digital signal with codes with reference to one of the codebooks held in the holding unit, wherein the first codebook shows one-to-one correspondence between N (N is a natural number) codes and N consecutive integers, said at least one second codebook shows one-to-one correspondence between M (M is a natural number less than N) codes and M integers, and the coding unit refers to one of the first and second codebooks held in the holding unit using integer values which are indicated by the digital signal.

According to the present invention as described above, different types of codebooks are used, focusing attention on the fact that representative points for quantization do not always need to be represented by representative points which are equally spaced within a range of values between the maximum and minimum values. To be more specific, representative points are represented by all the integer values within a range of values between the maximum and minimum values in the conventional codebook, whereas they can be represented by a smaller number of integer values than all the integer values within a range of values between the maximum and minimum values in the codebook of the present invention. As a result, distributions of representative points within the same range can be added, as a new feature, to the codebook of the present invention. In addition, variations in the numbers of representative points, which are smaller than the number of all the integers within a range of values between the maximum and minimum values, mean a plurality of codebooks of various quantization resolutions. Therefore, coding efficiency can be improved by switching the quantization resolutions depending on the number of bits of a stream to be generated. Furthermore, since the maximum value and the minimum value are same for all the codebooks, there is no need to do rescaling even if a codebook of a quantization resolution is switched into another codebook of another quantization resolution, and thus the calculation amount required for switching the codebooks can be reduced. As a result, it can be expected that the coding apparatus of the present invention produces various advantages such as reduction of power consumption when it is implemented in LSI and software.

As further information about technical background to this application, the disclosure of Japanese Patent Application No. 2003-170287 filed on Jun. 16, 2003 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 2 is a diagram showing an example of codebooks of various quantization resolutions which are stored in a codebook holding unit of the conventional coding apparatus as shown in FIG. 1;

FIG. 9 is a diagram showing an example of codebooks in the present embodiment as typified by the quantization method as shown in FIG. 6;

DETAILED DESCRIPTION OF THE INVENTION

The coding apparatus and the decoding apparatus in the embodiments of the present invention will be explained below with reference to the diagrams.

FIRST EMBODIMENT

Figure 1:
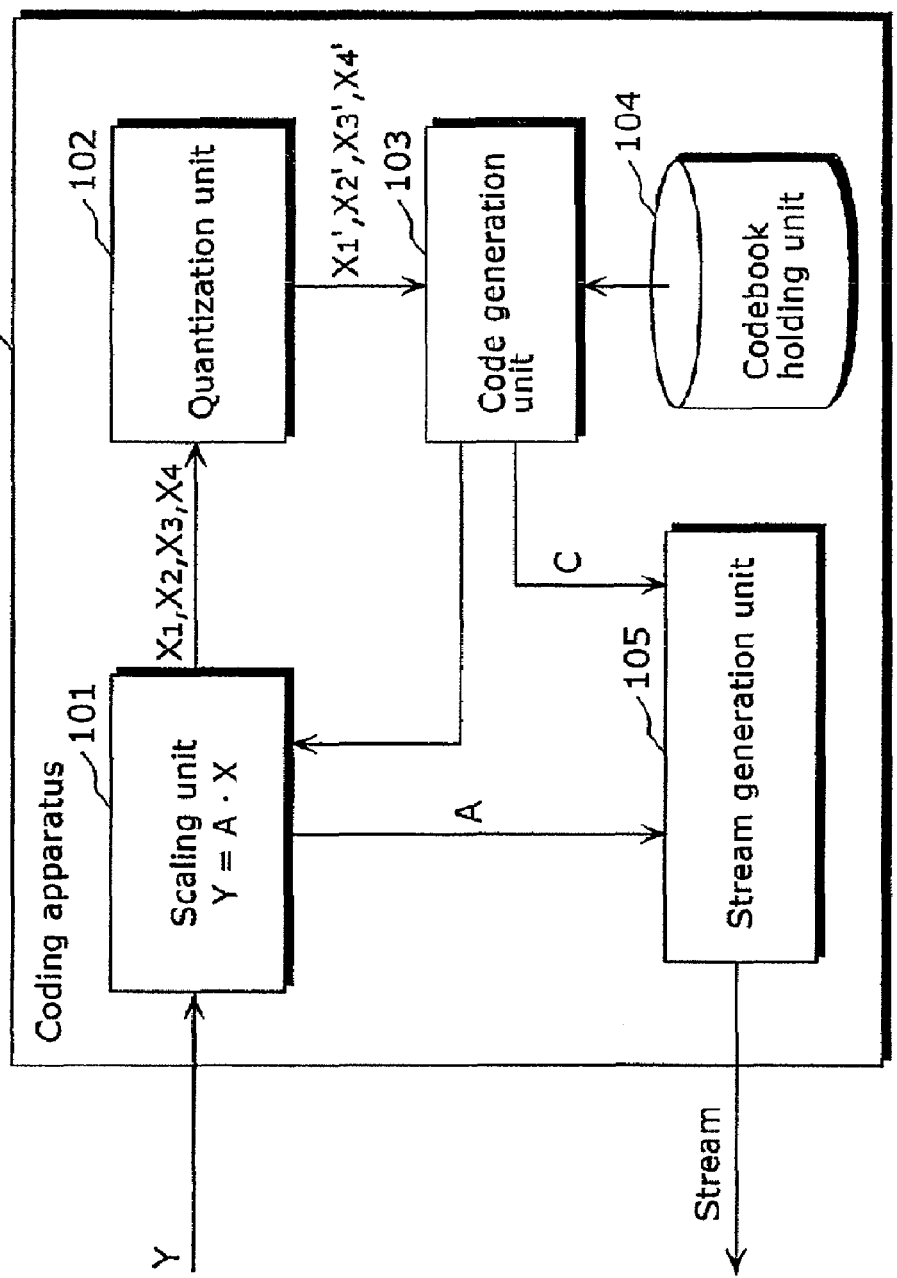
FIG. 1 is a diagram showing a configuration of a coding apparatus for coding an audio signal by the conventional AAC method.
Figure 5:
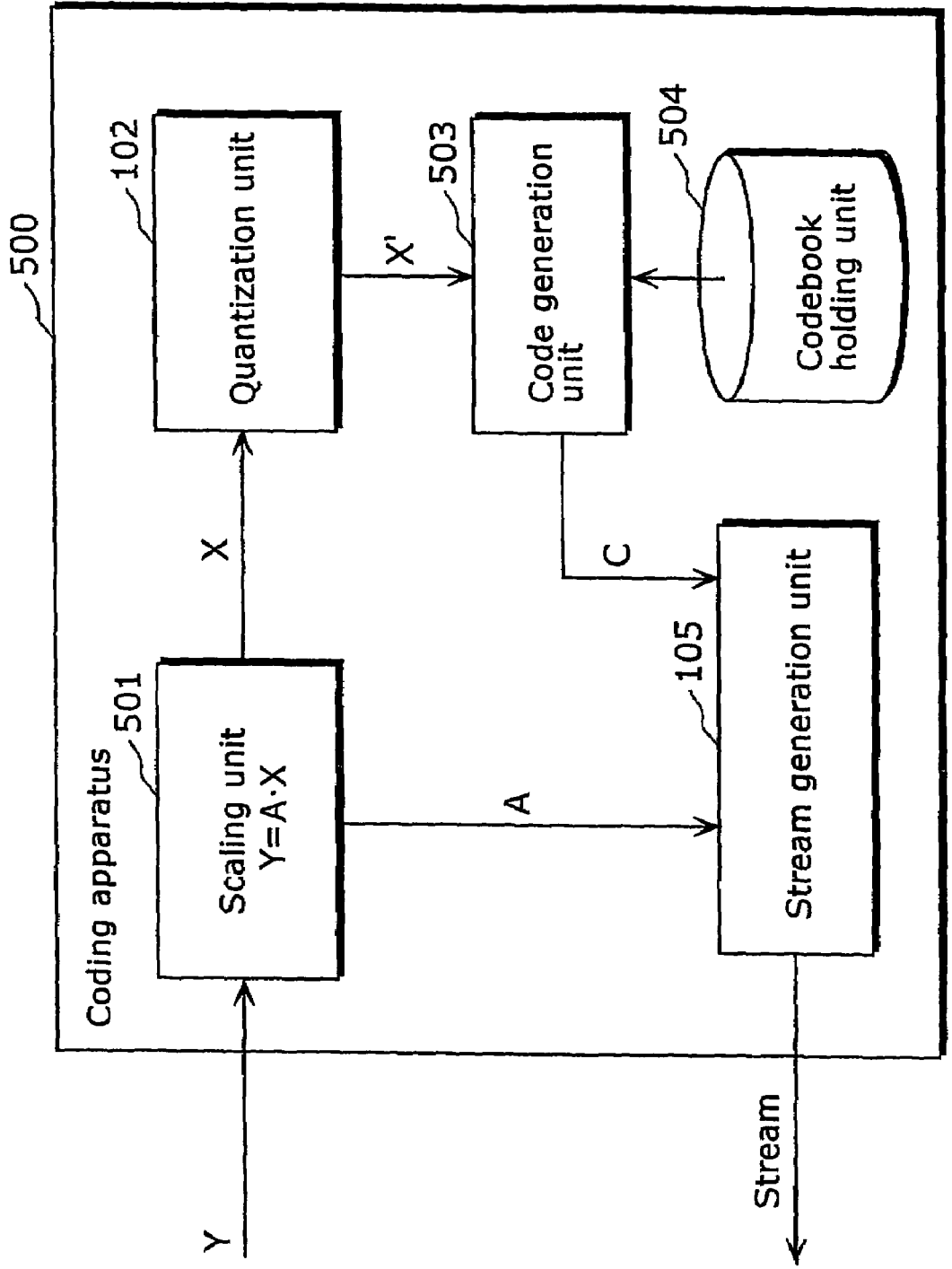
FIG. 5 is a block diagram showing a configuration of a coding apparatus in a first embodiment.

FIG. 5 is a block diagram showing a configuration of a coding apparatus 500 in the first embodiment. In FIG. 5, the same reference numbers are assigned to the same components of the coding apparatus 500 as those of the coding apparatus 100 as shown in FIG. 1. The coding apparatus 500 is a coding apparatus for performing coding with reference to one of a plurality of codebooks of various quantization resolutions. Here, these codebooks have various distributions of representative points for quantization within a range of values of the same integers, and have various quantization resolutions because of various numbers of representative points within that range of the integers. The coding apparatus 500 includes a quantization unit 102, a stream generation unit 105, a scaling unit 501, a code generation unit 503 and a codebook holding unit 504. The scaling unit 501 is same as the scaling unit 101 except that the former does not do rescaling when the code generation unit 503 switches a codebook to another codebook. As is the case with the scaling unit 101, the scaling unit 501 separates a digital signal to be coded, such as MDCT coefficient(s) Y, into a gain A and factor(s) X that are object(s) to be quantized, using Equation 1 or the like.

$$Y = A \cdot X \qquad \text{Equation 1}$$

Here, A and X may be integer values or floating-point values. For the sake of simplicity, X shall be floating-point values. The quantization unit 102 quantizes the inputted X into integer values X' by rounding-off or the like. The code generation unit 503 searches the codebook 504 for the codes that correspond respectively to the inputted integer values X', and outputs them as codes C. However, the code generation unit 503 is different from the code generation unit 103 in that the former examines bias in distribution of objects to be quantized by obtaining the average value and dispersion of the quantized values X' inputted from the quantization unit 102, and selects one group from the groups of codebooks according to the distribution bias so as to code the quantized values. Each group of codebooks that corresponds to distribution bias of objects to be quantized consists of a plurality of codebooks of various quantization resolutions. The code generation unit 503 first performs coding using the codebook of the highest quantization resolution among the selected group of codebooks, counts the total number of bits of the codes in a scale factor band, and judges whether or not the counted total number of bits is a target number of bits or less. When it is the target number of bits or less, the code generation unit 503 outputs, to the stream generation unit 105, the ID or the number of the codebook for identifying the codebook used for coding and the codes C obtained by the coding. When the total number of bits of the codes in the scale factor band is larger than the target number of bits, the code generation unit 503 switches the codebook into another codebook of one-level lower quantization resolution for coding. At this time, the code generation unit 503 does not instruct the scaling unit 501 to do rescaling, unlike the code generation unit 103. In this manner, the code generation unit 503 repeats coding and counting of the total number of bits until the total number of bits of the codes in the scale factor band becomes the target number of bits or less or there is no more codebooks of still lower quantization resolution. The stream generation unit 105 generates a bit stream using the gain A (or the index indicating the gain A) outputted from the scaling unit 501, the codes C outputted from the code generation unit 503, and the ID for identifying the codebook. The codebook holding unit 504 holds a plurality of groups of codebooks of various quantization resolutions, and each of the groups has its own distribution bias of the objects to be quantized, unlike the codebook holding unit 104 that holds only one group of codebooks of various quantization resolutions.

The codebooks used in the coding apparatus 500 which is configured as mentioned above will be explained in detail, compared with the conventional codebooks, because the present embodiment is characterized by how to configure groups of codebooks. The quantization method and the coding method in the present embodiment will be explained using FIG. 6, FIG. 7, FIG. 8 and FIG. 9. The conventional art will be explained using FIG. 2 and FIG. 3. Furthermore, in the present embodiment, the case where the values (objects to be quantized) X inputted to the quantization unit 102 are one-dimensional values.

Figure 6:
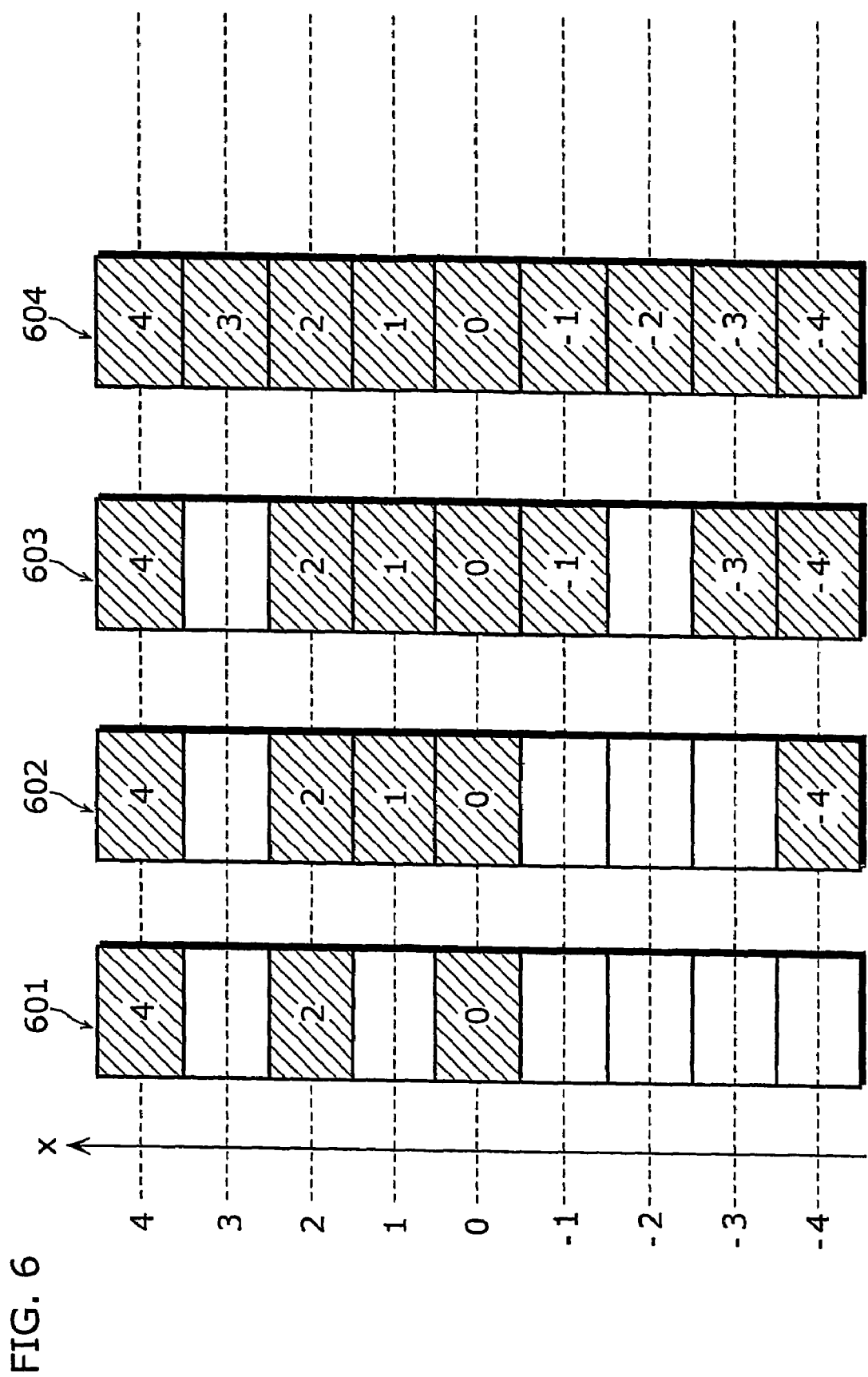
FIG. 6 is a diagram showing relationship between one pattern of distributions of representative points for quantization after scaling and quantization resolutions in a group of codebooks in which the distributions of the representative points are biased towards "+2"
Figure 7:
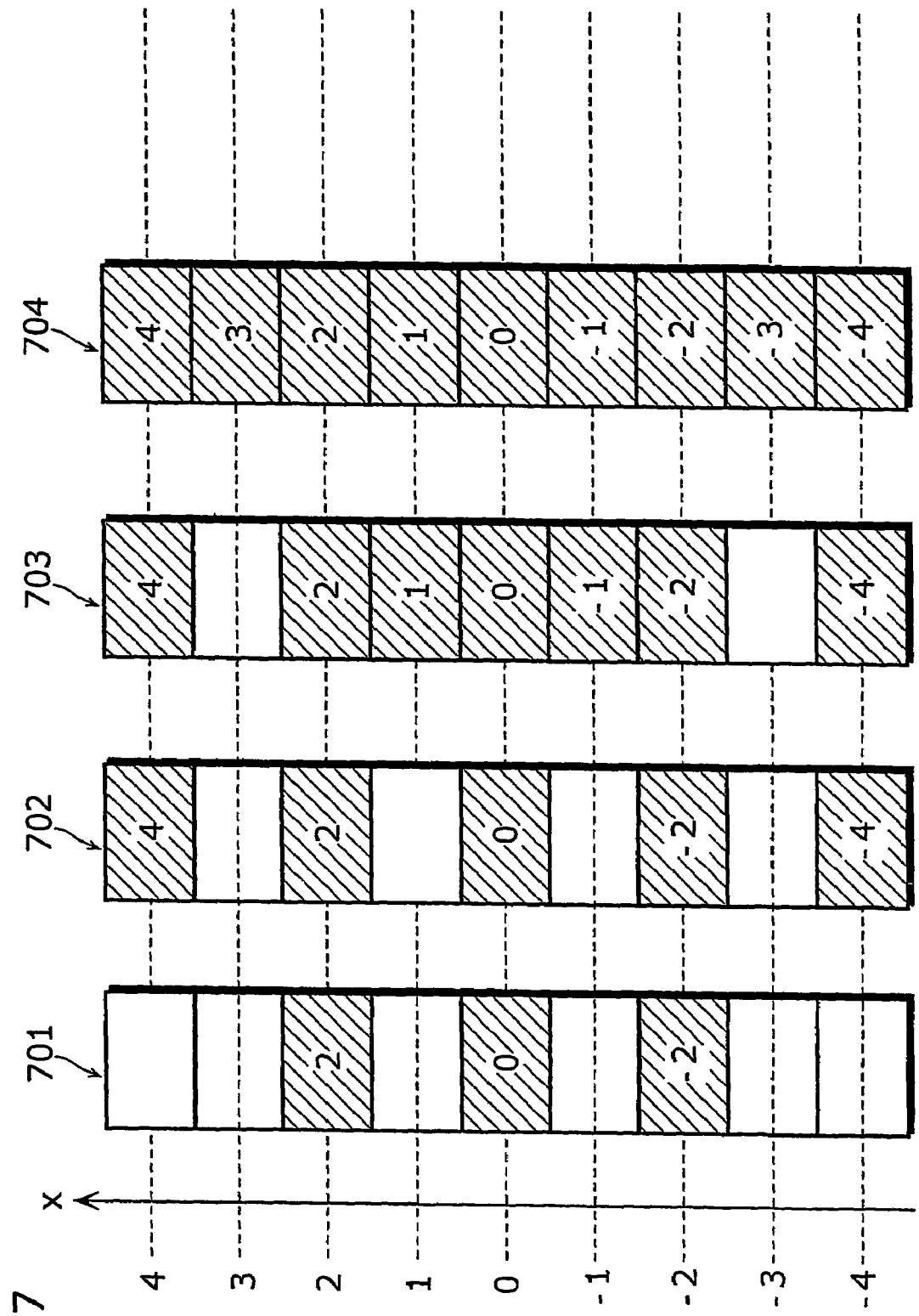
FIG. 7 is a diagram showing relationship between another pattern of distributions of representative points for quantization after scaling and quantization resolutions in a group of codebooks in which the equally spaced representative points are distributed around "0"
Figure 8:
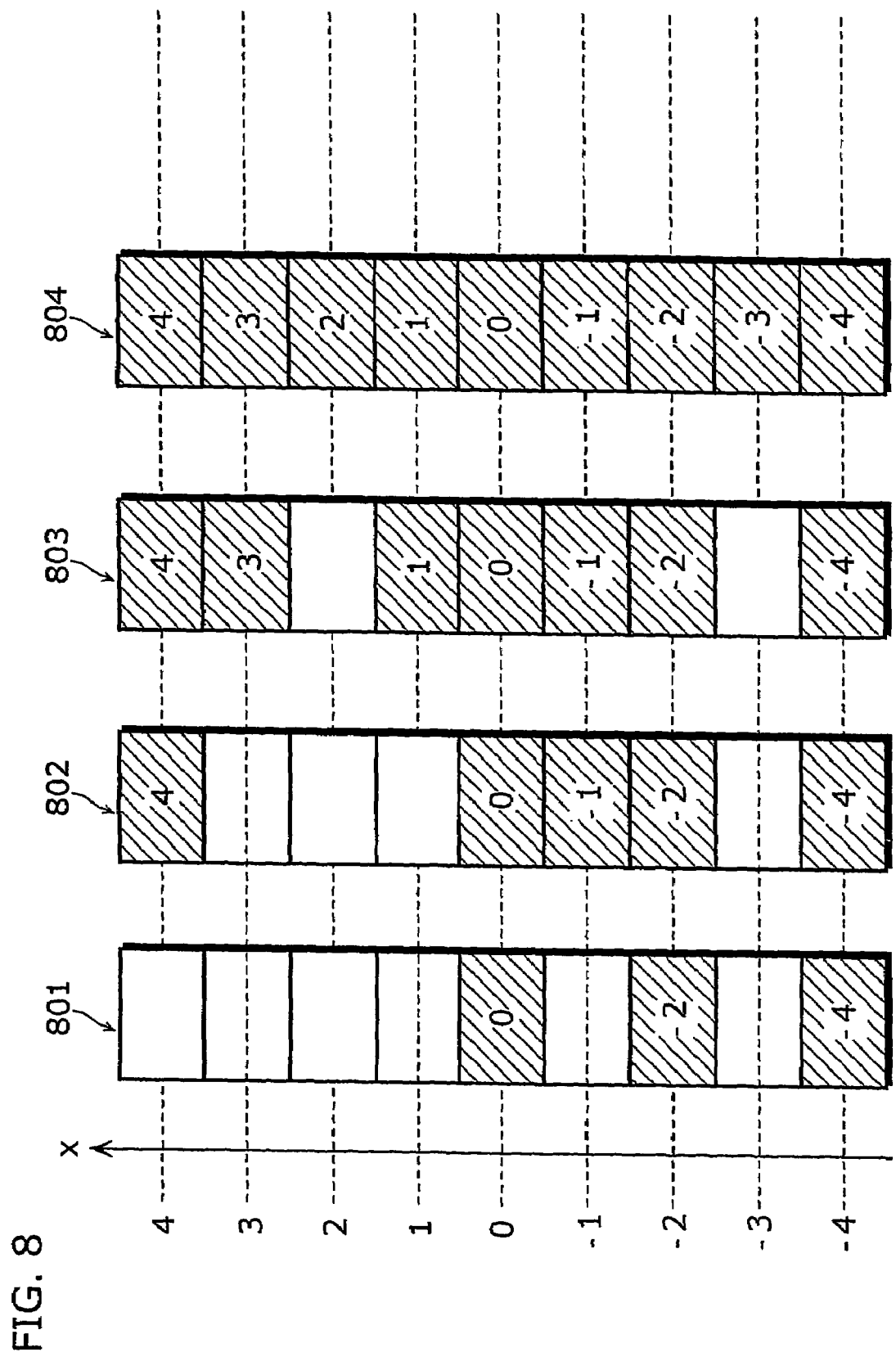
FIG. 8 is a diagram showing relationship between still another pattern of distributions of representative points for quantization after scaling and quantization resolutions in a group of codebooks in which the distributions of the representative points are biased towards "−2"

FIG. 6 is a diagram showing relationship between one pattern of distributions 601 to 604 of representative points for quantization after scaling and quantization resolutions in a group of codebooks in which the distributions of the representative points are biased toward "+2". FIG. 7 is a diagram showing relationship between another pattern of distributions 701 to 704 of representative points for quantization after scaling and quantization resolutions in a group of codebooks in which the equally spaced representative points are distributed around "0". FIG. 8 is a diagram showing relationship between still another pattern of distributions 801 to 804 of representative points for quantization after scaling and quantization resolutions in a group of codebooks in which the distributions of the representative points are biased toward "−2". Each hatched block in FIG. 6, FIG. 7 and FIG. 8 indicates each representative point.

FIG. 6 shows the distributions 601 to 604 of the representative points for quantization to which the codes are assigned, in the group of codebooks in which the distributions of the representative points are biased toward "+2". In the distribution 601 of the representative points, the codes are assigned to the integer values of the representative points "4", "2" and "0" among nine values from "−4" to "4". In the distribution 602, the codes are assigned to the representative points "4", "2", "1", "0" and "−4". In the distribution 603, the codes are assigned to the points "4", "2", "1", "0", "−1", "−3" and "−4". And in the distribution 604, the codes are assigned to all the nine integer values from "−4" to "4", as is the case with the conventional codebook 204.

FIG. 7 shows the distributions 701 to 704 of the representative points for quantization to which the codes are assigned, in the group of codebooks in which the equally spaced representative points are distributed around "0". In the distribution 701 of the representative points, the codes are assigned to the integer values of the representative points "2", "0" and "−2". In the distribution 702, the codes are assigned to the representative points "4", "2", "0", "−2" and "−4". In the distribution 703, the codes are assigned to the points "4", "2", "1", "0", "−1", "−2" and "−4". And in the distribution 704, the codes are assigned to all the nine integer values from "−4" to "4", as is the case with the conventional codebook 204.

FIG. 8 shows the distributions 801 to 804 of the representative points for quantization to which the codes are assigned, in the group of codebooks in which the distributions of the representative points are biased toward "−2". In the distribution 801 of the representative points, the codes are assigned to the integer values of the representative points "0", "−2" and "−4". In the distribution 802, the codes are assigned to the representative points "4", "0", "−1", "−2" and "−4". In the distribution 803, the codes are assigned to the points "4", "3", "1", "0", "−1", "−2" and "−4". And in the distribution 804, the codes are assigned to all the nine integer values from "−4" to "4", as is the case with the conventional codebook 204.

Figure 3:
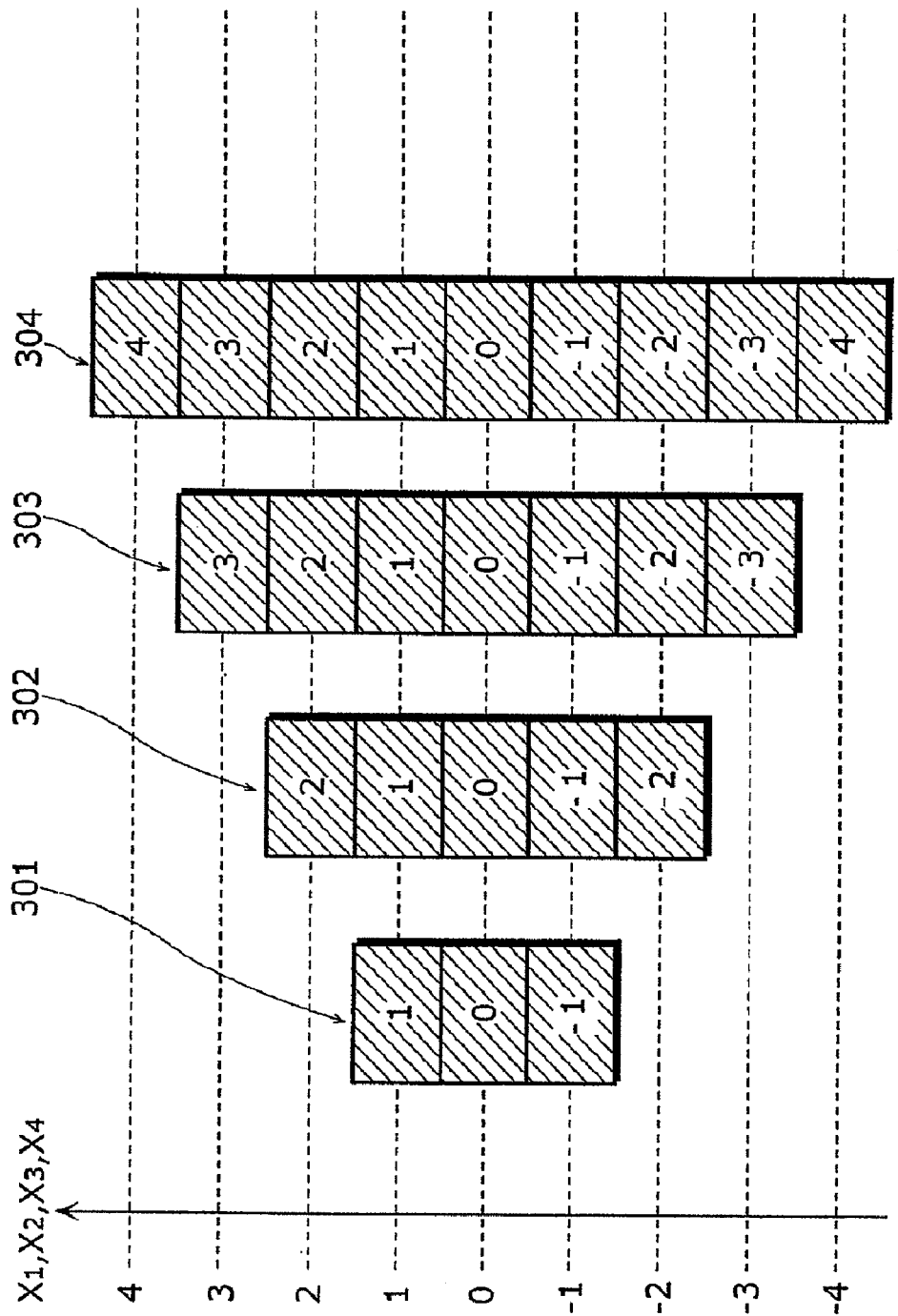
FIG. 3 is a diagram showing distributions of representative points for quantization (quantized values X') used for quantization of objects to be quantized X with reference to each of the codebooks in FIG. 2.
Figure 4:
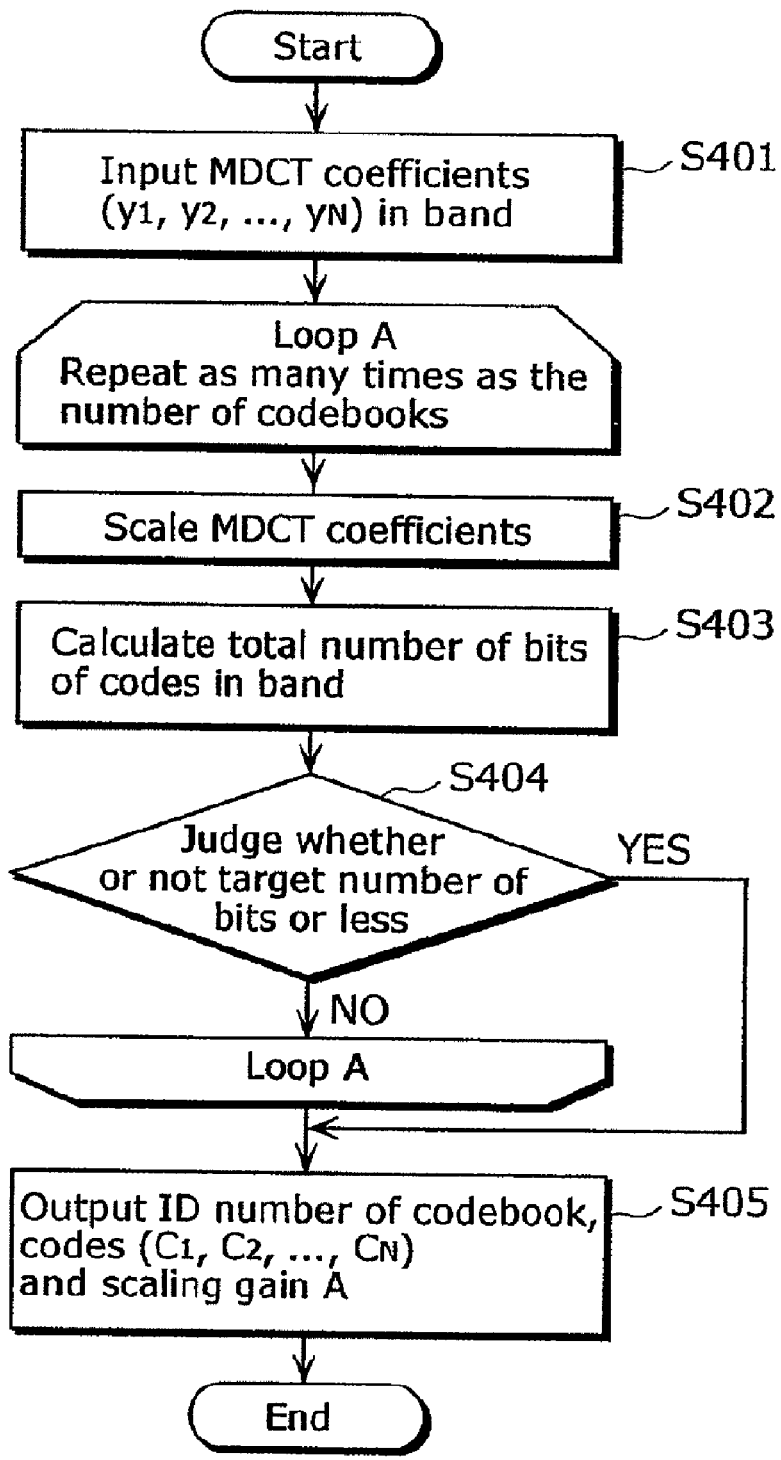
FIG. 4 is a flowchart showing an example of the procedures in the coding processing in the case where the conventional coding apparatus performs coding using the codebooks of various quantization resolutions.

In each of the distributions 601, 701 and 801 of the representative points in FIG. 6, FIG. 7 and FIG. 8, the number of blocks that are hatched as representative points is three, which is same as the number of hatched blocks in the distribution 301 in FIG. 3. In each of the distributions 602, 702 and 802 of the representative points in FIG. 6, FIG. 7 and FIG. 8, the number of blocks that are hatched as representative points is five, which is same as the number of hatched blocks in the distribution 302 in FIG. 3. In each of the distributions 603, 703 and 803 of the representative points in FIG. 6, FIG. 7 and FIG. 8, the number of blocks that are hatched as representative points is 7, which is same as the number of hatched blocks in the distribution 303 in FIG. 3. In each of the respective distributions 604, 704 and 804 of the representative points in FIG. 6, FIG. 7 and FIG. 8, the number of representative points and the distribution thereof are identical to those in the distribution 304 in FIG. 3. The number of hatched blocks, on which attention is focused here, indicates the number of codes in the codebook of each quantization resolution.

In FIG. 6, FIG. 7, FIG. 8 and FIG. 3, the same number of codes are described in the codebooks of each of the following distribution patterns that correspond to quantization resolutions: (1) the distributions 601, 701, 801 and 301 of representative points; (2) the distributions 602, 702, 802 and 302; (3) the distributions 603, 703, 803 and 303; and (4) the distributions 604, 704, 804 and 304. In other words, it means that the codebooks used for quantization of the same quantization resolution have the same number of codes, in FIG. 6, FIG. 7, FIG. 8 and FIG. 3.

Next, focusing on the distributions of the representative points in FIG. 6 only, the hatched blocks in the distribution 601 are always hatched in the distribution 602, the hatched blocks in the distribution 602 are always hatched in the distribution 603, and the hatched blocks in the distribution 603 are always hatched in the distribution 604. In short, in the distribution 604, all the blocks within a range between the maximum value and the minimum value are hatched. This holds true for the distributions 701 to 704 and 801 to 804 in FIG. 7 and FIG. 8. The hatched blocks in the distributions 701 and 801 are always hatched in the distributions 702 and 802, the hatched blocks in the distributions 702 and 802 are always hatched in the distributions 703 and 803, and the hatched blocks in the distributions 703 and 803 are always hatched in the distributions 704 and 804. In short, in the distributions 704 and 804, all the blocks within a range between the maximum value and the minimum value are hatched. Here, quantization using the codebooks in which quantized values are distributed as shown in the distributions 601, 701 or 801 is referred to as "quantization of the first layer". Similarly, quantization using the distributions 602, 702 or 802 is referred to as "quantization of the second layer", quantization using the distributions 603, 703 or 803 is referred to as "quantization of the third layer", and quantization using the distributions 604, 704 or 804 is referred to as "quantization of the fourth layer". In addition, codebooks used for quantization of the first, second, third and fourth layers are respectively referred to as a "first layer codebook", a "second layer codebook", a "third layer codebook", and a "fourth layer codebook".

Any of the quantization methods of the first through fourth layers can be applied to the case where the objects to be quantized are scaled so as to be the values between the maximum value "4" and the minimum value "−4". Therefore, rescaling is not needed even if the quantization method is changed to any of the methods of the first through fourth layers, namely, one of the first through the fourth layer codebooks is switched into another of them. In addition, the quantization resolution can be scaled up securely as the layer number is increased from the first up to the fourth. In the quantization method of the fourth layer in the present embodiment, coding is performed using the same codebook as that in the quantization method of the conventional distribution 304. Therefore, in the case, for example, where it is predetermined to perform coding by the quantization method of the highest resolution, there is no need to do rescaling for coding at the highest resolution, unlike the conventional method. All that has to be done is switch the codebook. In addition, in the case where the signal distribution of objects to be quantized is previously given, the quantized values in each layer are not limited to a sequence of integer values, and can be set more flexibly, depending on the distribution, than those in the conventional art.

FIG. 9 is a diagram showing an example of codebooks in the present embodiment, as typified by the quantization methods as shown in FIG. 6. FIG. 2 shows the conventional codebooks as typified by the quantization methods as shown in FIG. 3.

In the codebook 901, quantized values, as representative points for quantization, can be any of three integers (for example, "4", "2" and "0") between the maximum value "4" and the minimum value "−4", and the codes for all the three quantized values are represented as binary values using 0 and 1 (for example, 111, 100 and 0). In the codebook 902, quantized values, as representative points for quantization, can be any of five integers (for example, "4", "2", "1", "0" and "−4") between the maximum value "4" and the minimum value "−4", and the codes for all the five quantized values are represented as binary values using 0 and 1 (for example, 1010, 100, 00, 01 and 1011). In the codebook 903, quantized values can be any of seven integers (for example, "4", "2", "1", "0", "−1", "−3" and "−4") between the maximum value "4" and the minimum value "−4", and the codes for all the seven quantized values are represented as binary values using 0 and 1 (for example, 10101, 10100, 100, 00, 01, 10110 and 10111). In the codebook 904, quantized values can be any of the integers ("4", "3", "2", "1", "0", "−1", "−2", "−3" and "−4") between the maximum value "4" and the minimum value "−4", and the codes for all the quantized values are represented as binary values using 0 and 1 (for example, 1010001, 10101, 1010000, 100, 00, 01, 10110, 10111 and 1010010). These codes are just examples, and the present invention is not limited to them.

The quantized values in the codebook 904 always include the quantized values in the codebook 903. The quantized values in the codebook 903 always include the quantized values in the codebook 902. The quantized values in the codebook 902 always include the quantized values in the codebook 901. Therefore, it is possible to reduce quantization errors, or at least to avoid increase in quantization errors, if quantization is performed using the codebook 902 rather than the codebook 901. Similarly, it is possible to reduce quantization errors, or at least to avoid increase in quantization errors, if quantization is performed using the codebook 903 rather than the codebook 902. Similarly, it is possible to reduce quantization errors, or at least to avoid increase in quantization errors, if quantization is performed using the codebook 904 rather than the codebook 903. Therefore, the coding apparatus 500 does not need to do rescaling when switching the codebook, if only it scales the MDCT coefficients so that the values thereof fall within a range between the maximum value "4" and the minimum value "−4" in the present embodiment. In addition, quantization errors can be reduced as the layer number increases from the codebook 901 up to the codebook 904.

On the other hand, FIG. 9 shows that the numbers of bits of codes are smaller in the codebook 901 of the lowest quantization resolution, whereas the numbers of bits of codes are larger in the codebooks of the higher quantization resolutions. For example, the quantized value "4" is represented as 111 by 3 bits in the codebook 901 of the lowest quantization resolution, but is represented as 1010 by 4 bits in the codebook 902 of the higher quantization resolution. It is represented as 10101 by 5 bits in the codebook 903 of the still higher quantization resolution, and is represented as 1010001 by 7 bits in the codebook 904 of the highest quantization resolution. As mentioned above, as the codebook number increases from the codebook 901 up to the codebook 904, the number of representative points increases, and thus the bit consumption grows, in general. In other words, it is possible to reduce bit consumption by performing quantization for coding using a codebook with a smaller number of representative points for quantization, or to reduce quantization errors by performing quantization for coding using a codebook with a larger number of representative points for quantization although bit consumption increases.

Figure 10:
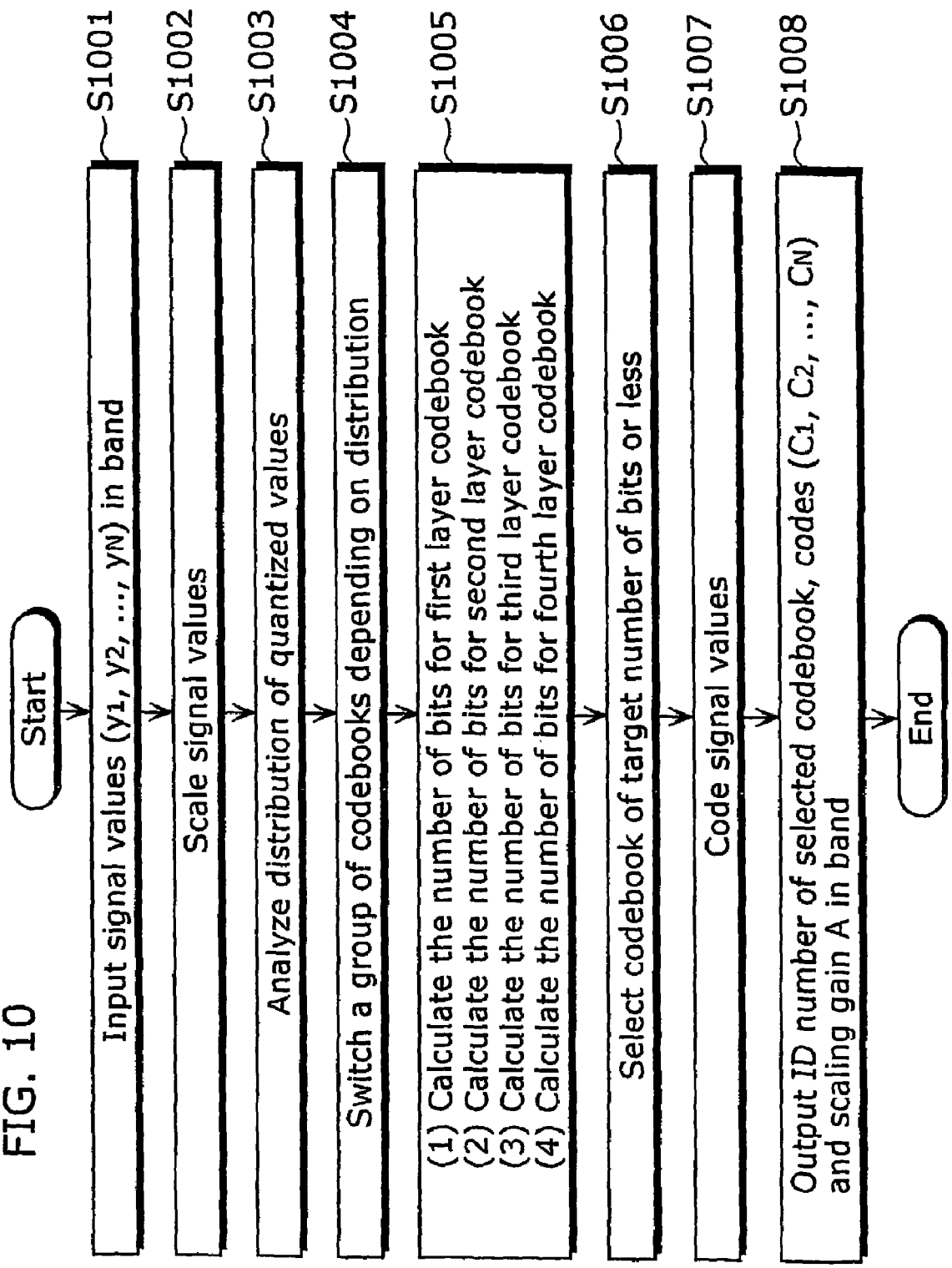
FIG. 10 is a flowchart showing operations of the coding apparatus in the present embodiment.

FIG. 10 is a flowchart showing operations in the coding apparatus 500 in the present embodiment. First, "N" number of (where N is a natural number) signal values ($y_1$, $y_2$, $y_3$, ..., $y_N$) in each band are inputted to the scaling unit 501 (S1001), and the scaling unit 501 scales the signal values ($y_1$, $y_2$, $y_3$, ..., $y_N$) so that the values thereof fall within a predetermined range of values (S1002). To be more specific, the scaling unit 501 scales the signal values ($y_1$, $y_2$, $y_3$, ..., $y_N$) so that the scaled signal values $x_k = y_k/A$ (where k=1, 2, ... N) fall within a predetermined range, that is, a range between the maximum number "4" and the minimum number "−4", for example. The quantization unit 102 rounds off the scaled signal values $x_k$ by a predetermined method, for example, by counting fractions over ½ as one and disregarding the rest. The code generation unit 503 analyzes the distribution of the quantized values $x_k'$ obtained by rounding-off (S1003). To be more specific, it calculates the average value and the distribution of the quantized values $x_k'$ (k=1, 2, ..., N) in the band.

The average value shows where the bias of the quantized values $x_k'$ is centered. The distribution shows how far the quantized values $x_k'$ in the band are biased from the center of the bias. The code generation unit 503 switches the group of codebooks into the most suitable one for the distribution of the quantized values $x_k'$ according to the analysis result (S1004). The code generation unit 503 reads out, from the codebook holding unit 504, the codebooks for all the layers belonging to the suitable group, and reads out, from the codebook for each layer, the codes $C_k$ which are to be assigned to the quantized values $x_k'$ (k=1, 2, . . . , N). The code generation unit 503 further assigns the read-out codes $C_k$ to the "N" quantized values $x_k'$ in the band (k=1, 2, . . . , N), and calculates the total number of bits of the codes in the band for each layer (S100S).

It is assumed here that the processing of the first to fourth layers are performed in parallel. To be more specific, in the code generation unit 503, (1) a processing unit for performing the processing of the first layer reads out the codes $C_{k1}$ for the first layer which are to be assigned to the quantized values $x_k'$ (k=1, 2, . . . N). (2) In parallel with the processing (1), a processing unit for performing the processing of the second layer reads out the codes $C_{k2}$ for the second layer which are to be assigned to the quantized values $x_k'$ (k=1, 2, . . . , N). (3) In parallel with the processing (2), a processing unit for performing the processing of the third layer reads out the codes $C_{k3}$ for the third layer which are to be assigned to the quantized values $X_k'$ (k=1, 2, . . . , N). (4) In parallel with the processing (3), a processing unit for performing the processing of the fourth layer reads out the codes $C_{k4}$ for the fourth layer which are to be assigned to the quantized values $x_k'$ (k=1, 2, . . . , N). Next, the code generation unit 503 calculates the total number of bits of the "N" codes ($C_1, C_2, C_3, \ldots, C_N$) in the scale factor band. To be more specific, (1) the processing unit for performing the processing of the first layer calculates the total number of bits of the codes $C_{k1}$ (k=1, 2, . . . , N) for the first layer in the band. (2) In parallel with the processing (1), the processing unit for performing the processing of the second layer calculates the total number of bits of the codes $C_{k2}$ (k=1, 2, . . . , N) for the second layer in the band. (3) In parallel with the processing (2), the processing unit for performing the processing of the third layer calculates the total number of bits of the codes $C_{k3}$ (K=1, 2, . . . , N) for the third layer in the band. (4) In parallel with the processing (3), the processing unit for performing the processing of the fourth layer calculates the total number of bits of the codes $C_{k4}$ (k=1, 2, . . . , N) for the fourth layer in the band. The code generation unit 503 selects the codebook for the layer in which the total number of bits calculated for that layer is the target number of bits or less. Or, in the case where no total number of bits for any layers is the target number of bits or less, the code generation unit 503 selects the first layer codebook (S1006).

The code generation unit 503 codes the signal values In the band using the codebook selected in Step S1006 (S1007), and outputs, to the stream generation unit 105, the ID (or the number or the like) of the codebook used for coding the signal values in the band and the codes ($C_1, C_2, C_3, \ldots, C_N$) in the band. The stream generation unit 105 outputs a stream including: the ID of the codebook and the codes ($C_1, C_2, C_3, \ldots, C_N$) in the scale factor band, which are outputted from the code generation unit 503; and the scaling gain A which is outputted from the scaling unit 501 (S1008). After that, the signal values in the next band are inputted into the coding apparatus 500, and the same processing as the above-mentioned processing is started from Step S1001.

As described above, according to the coding apparatus 500 in the present embodiment, there is no need to do rescaling every time the code generation unit 503 switches a codebook, so the processing load on the coding apparatus 500 can be reduced. In addition, since the coding apparatus 500 holds a plurality of groups of codebooks with various distributions of representative points for quantization, the optimum codebook can be selected depending upon a distribution of quantized values, in the case where the distribution thereof is previously given, and thus more accurate quantization and coding can be realized. Furthermore, since each group has a plurality of codebooks of various quantization resolutions, more efficient coding can be performed.

Figure 11:
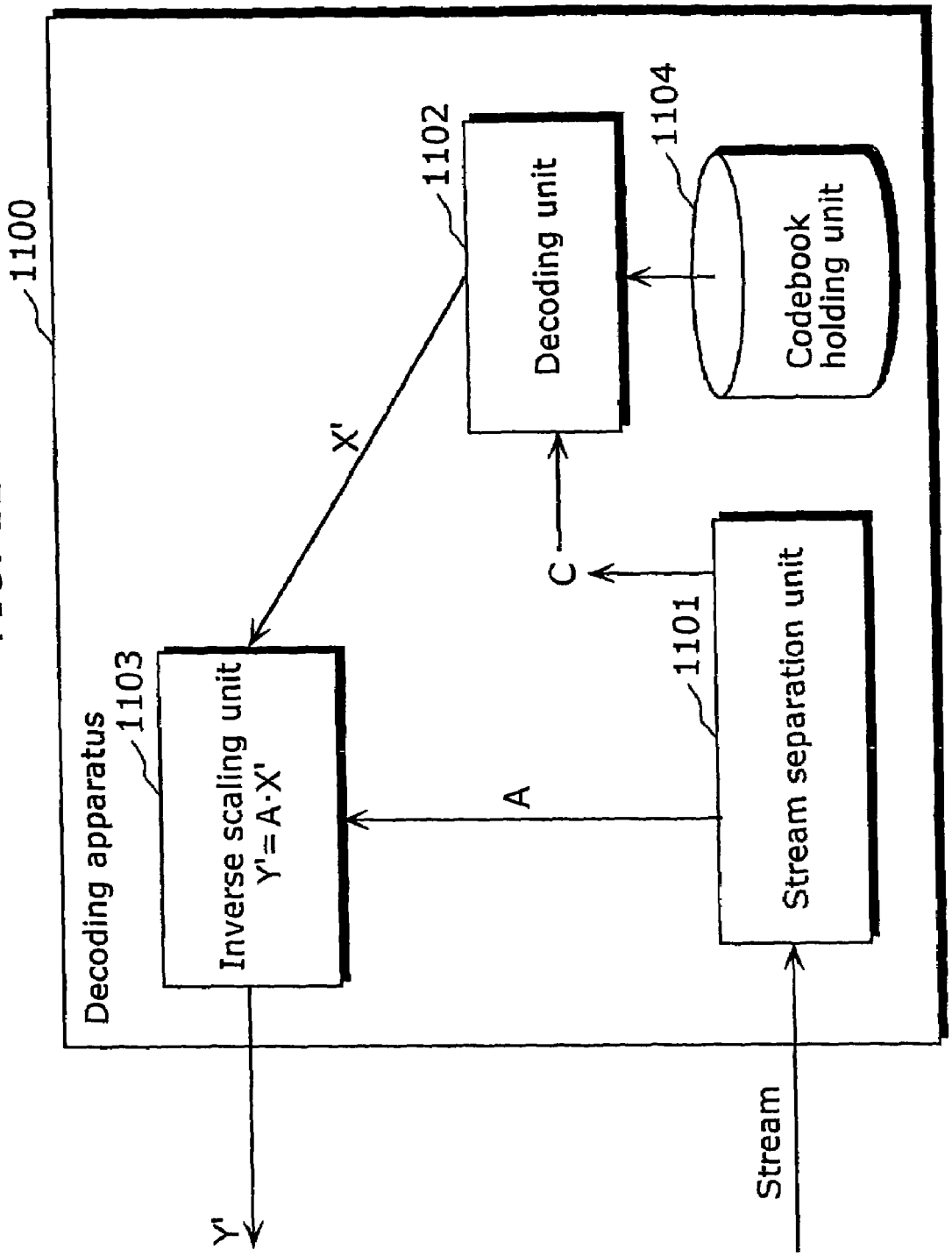
FIG. 11 is a block diagram showing a configuration of a decoding apparatus in the first embodiment.

FIG. 11 is a block diagram showing a configuration of a decoding apparatus 1100 in the first embodiment. The decoding apparatus 1100 in the first embodiment is a decoding apparatus for decoding a stream coded by the coding apparatus 500 in the first embodiment. This decoding apparatus 1100 includes a stream separation unit 1101, a decoding unit 1102, an inverse scaling unit 1103 and a codebook holding unit 1104. A bit stream is inputted to the stream separation unit 1101 in the decoding apparatus 1100 from outside via a recording medium or a transmission path. The stream separation unit 1101 separates the gain A, the codes C, and the number or the ID for identifying the codebook from the stream, according to a predetermined stream syntax. The separated codes C and the number for identifying the codebook are inputted to the decoding unit 1102. The separated gain A is inputted to the inverse scaling unit 1103. The codebooks stored in the codebook holding unit 1104 are same as those stored in the codebook holding unit 504 in the coding apparatus 500 as shown in FIG. 5. The decoding unit 1102 identifies one of the codebooks stored in the codebook holding unit 1104 based on the number for identifying the codebook. Referring to the identified codebook, the decoding unit 1102 further decodes the codes C into the quantized values X' based on the quantized values X' and the corresponding codes C described in the codebook. The quantized values X' outputted from the decoding unit 1102 and the gain A separated from the stream are inputted to the inverse scaling unit 1103. The inverse scaling unit 1103 amplifies the quantized values X' outputted from the decoding unit 1102 with the gain A, according to the equation 2 or the like, so as to obtain the values Y' of the MDCT coefficients, for example.

$$Y'=A \cdot X' \quad \text{Equation 2}$$

As described above, according to the present embodiment, the coding efficiency in the coding apparatus 500 can be improved without significant increase in the calculation amount thereof, if only the codebooks stored in the codebook holding unit 504 in the coding apparatus 500 are changed into any of the codebooks with various distributions of representative points as shown in FIG. 6 to FIG. 8. In addition, when decoding the bit stream generated in the coding apparatus 500, the decoding apparatus 1100 can decode the stream into a digital signal, without difficulty, based on the gain A, the codes C and the number or the ID for identifying the codebook which are described on the stream.

SECOND EMBODIMENT

Figure 12:
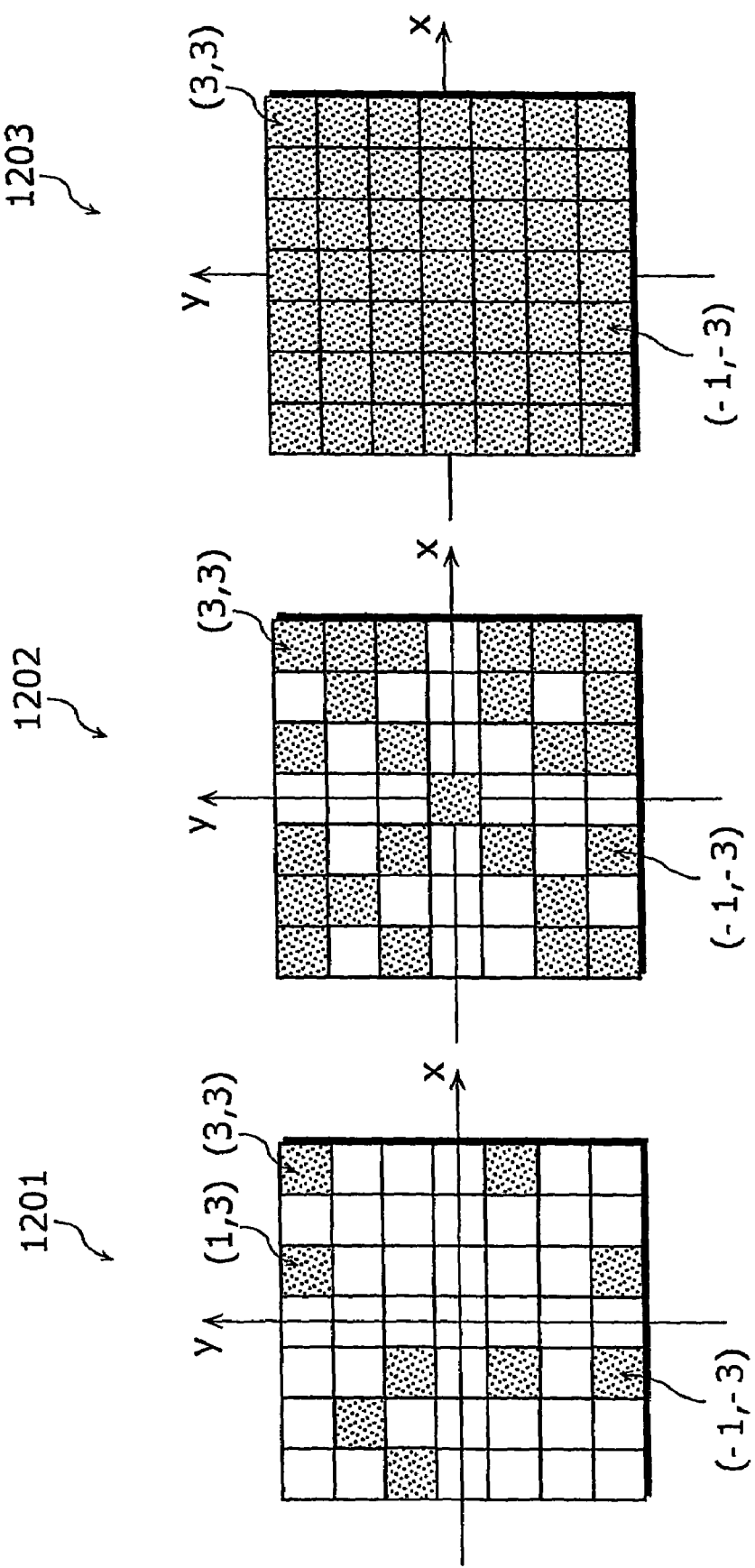
FIG. 12 is a diagram showing an example of two-dimensional distributions of representative points of codebooks used for coding in a coding apparatus in a second embodiment.
Figure 13:
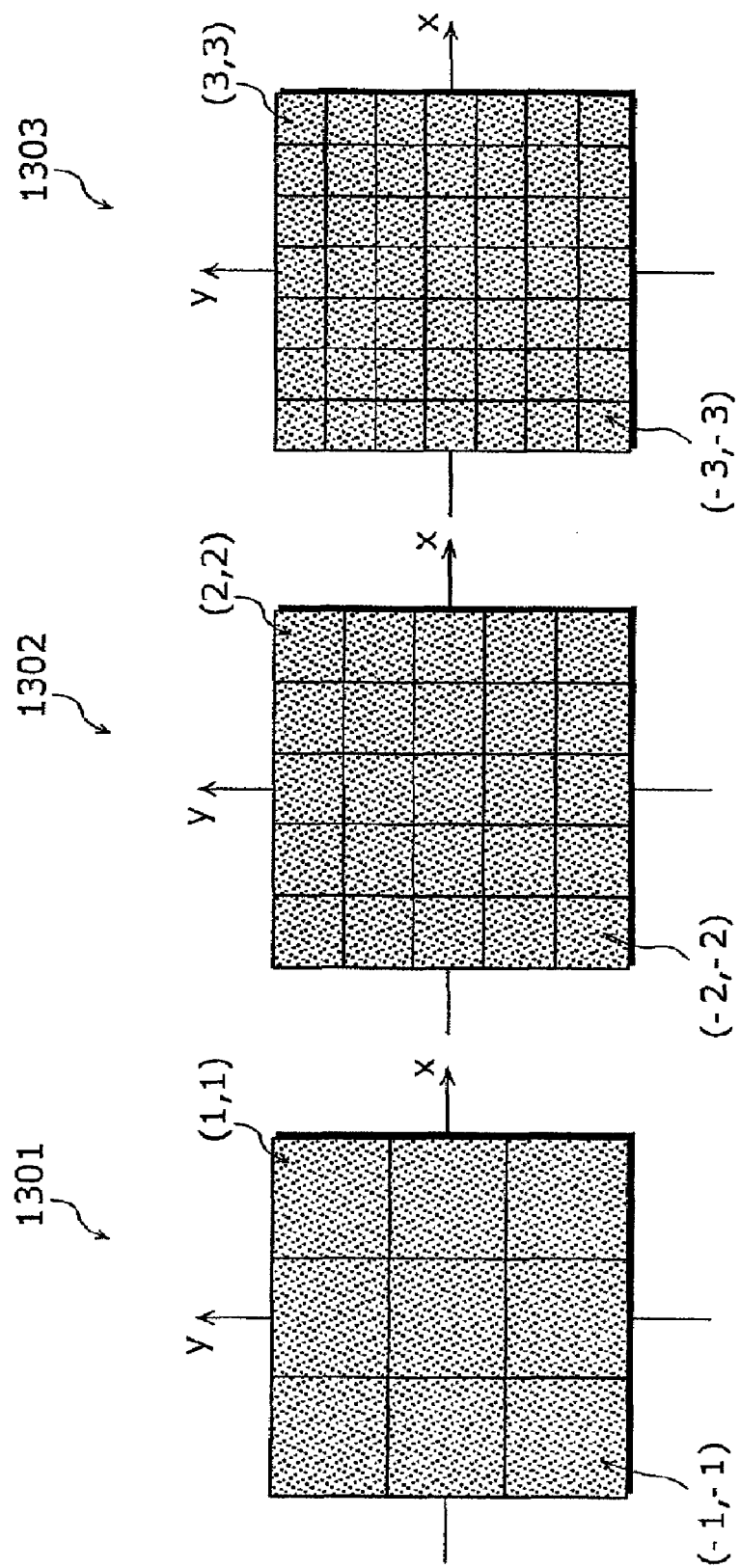
FIG. 13 is a diagram showing an example of two-dimensional distributions of representative points of codebooks used in a conventional coding method such as AAC.

In the first embodiment, the case where the objects to be quantized are one-dimensional signal values has been explained. However, the objects to be quantized do not always need to be one-dimensional ones, and may be multi-dimensional ones. The case where the objects to be quantized are two-dimensional signal values will be explained below as an example for the sake of simplicity, referring to FIG. 12 and FIG. 13. FIG. 12 is a diagram showing an example of two-dimensional distributions of representative points in codebooks used for coding in a coding apparatus in a second embodiment. FIG. 13 is a diagram showing an example of two-dimensional distributions of representative points in codebooks used in a conventional coding method such as AAC. FIG. 12 and FIG. 13 show schematically the distributions of representative points for quantization in the case where the horizontal axis is x, the vertical axis is y and two-dimensional vector (x, y) consisting of two components x and y is given. Here, the quantized values of two continuous samples, for example, may be applied to the two-dimensional vector components.

In the present embodiment, quantization method as shown in FIG. 12 is used, for example. To be more specific, in any of the first layer distribution 1201, the second layer distribution 1202 and the third layer distribution 1203, the maximum values and the minimum values of the x and y components are all same, $-3 \leq x \leq 3$ and $-3 \leq y \leq 3$, and only the number of representative points increases as the layer number increases from the first layer distribution 1201 up to the third layer distribution 1203. Under this structure, once the objects to be quantized are scaled and it is found that they are included in any areas of the third layer distribution 1203, it is possible to select the codebook for the layer with the highest coding efficiency so as to perform coding, using the scaled values as they are, without rescaling them. For example, the objects to be quantized and the representative points do not always match with each other in the second layer distribution 1202 or the first layer distribution 1201. In that case, it is possible to judge to which hatched area (representative point), in the second layer distribution 1202 or the first layer distribution 1201, each object to be quantized is close, and determine the representative point in the closest hatched area as a quantized value to be coded. As is the case with the one-dimensional distributions, the number of representative points increases from the first layer distribution 1201 up to the third layer distribution 1203 as the layer number for quantization increases. Therefore, for reduction of quantization errors in return for increase in bit consumption, it is possible to use, for quantization, a codebook with a larger number of representative points. On the other hand, for reduction of bit consumption in return for possible increase in quantization errors, it is possible to use, for quantization, a codebook with a smaller number of representative points. In addition, the representative points for quantization in a codebook can be created arbitrarily with no limitation of equal spacing, based on the distribution of the objects to be quantized, so improvement of coding efficiency can be expected.

On the contrary, according to the conventional coding method like AAC, the distribution of representative points for quantization, for example, the first layer distribution 1301, is divided into nine areas by determining the maximum value and the minimum value in each of the x axis direction and the y axis direction and dividing the distance between the maxim value and the minimum value into three areas. When an object to be quantized is scaled and plotted in any of the nine areas, it is quantized using the representative point (quantized value) in that area. For example, in the first layer distribution 1301, 9 points (−1, −1), (−1, 0), (−1, 1), (0, −1), (0, 0), (0, 1), (1, −1), (1, 0) and (1, 1) are used as the representative points for quantization, when the maximum value and the minimum value after scaling are "1" and "−1" respectively. Similarly, the distance between the maximum and minimum values are divided into five areas in the second layer distribution 1302, and the distance between the maximum and minimum values are divided into seven areas in the third layer distribution 1303. In any case, in the conventional codebook, multi-dimensional distribution of representative points for quantization is represented by equally spaced representative points, as is the case with the one-dimensional distribution thereof. In addition, in the case where a codebook is switched into another codebook (for example, from the first layer codebook into the second layer codebook), resealing has to be done and thus the calculation amount increases.

It should be noted that only the case where one pattern of distribution bias of representative points, as shown in FIG. 12, has been explained in the second embodiment, but the present invention is not limited to that case. It is needless to say that the present invention may, as is the case with the first embodiment, hold groups of codebooks for plural patterns of distributions.

Furthermore, the case where an inputted signal to be coded (objects to be quantized) is an audio signal has been explained in the above embodiments, but the present invention is not limited to that case, and any kind of signals may be inputted if only the coding method of the present invention can be applied to those signals. For example, a video signal may be inputted. In the case where the inputted signal to be coded is a video signal, no scaling processing is performed on inputted DCT coefficients, but more efficient coding can be performed using a plurality of codebooks included in the coding apparatus, depending on various distributions of objects to be quantized.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The coding apparatus according to the present invention is of value as a coding apparatus included in a personal computer, a personal digital assistant (PDA), a broadcast station for digital broadcasting, a mobile phone and the like having a function of compressing and coding audio signals and video signals.

The codebook according to the present invention is of value as a codebook included in a coding apparatus for compressing and coding audio signals and video signals, and as a codebook included in a decoding apparatus for decoding a bit stream coded by the coding apparatus.

The invention claimed is:

1. A coding apparatus for coding a digital signal with reference to a codebook, comprising:
   a holding unit operable to hold a first codebook and at least one second codebook;
   a scaling unit operable to scale inputted signal values so that the signal values fall within a predetermined range of values including N, N being a natural number, consecutive integers;
   a quantizing unit operable to quantize the scaled signal values respectively into digital signal values within a range of values of the N integers;
   a coding unit operable to replace a digital signal with codes with reference to either the first codebook or the at least one second codebook held in said holding unit, corresponding to a set of the quantized digital signal values quantized by said quantizing unit; and
   a selecting unit operable to select another codebook, which said coding unit is to refer to, of different quantization resolution, from among either the first codebook or the at least one second codebook depending on a set of the quantized signal values quantized by said quantizing unit, wherein the first codebook shows one-to-one correspondence between N codes and the N integers, the at least one second codebook shows one-to-one correspondence between M, M is a natural number less than N, codes and M integers which are a subset of the N integers, the at least one second codebook having quantization resolution lower than quantization resolution of the first codebook, and said coding unit refers to, even when switching the codebook being referred to based on the codebook selected by the selecting unit, the codebook using the same integer values which are indicated by the quantized digital signal quantized by said quantization unit, and replaces the integer values which are indicated by the quantized digital signal with codes with reference to the selected codebook.

2. The coding apparatus according to claim 1, wherein when said holding unit holds a plurality of second codebooks, the plurality of second codebooks respectively show one-to-one correspondence between M1, M2, ..., Mm, M1, M2, ..., Mm are natural numbers, codes and M1, M2, ..., Mm integers, the M1, M2, ..., Mm being different numbers from each other, and the M1, M2, ..., Mm integers including a set of integers that is common to all the second codebooks, m being different for each of the plurality of second codebooks.

3. The coding apparatus according to claim 2, wherein, when selecting a codebook other than said first codebook, said selecting unit calculates an average value and a distribution of the digital signal values, examines the set of the quantized signal values, and selects one second codebook based on a result of the examination.

4. The coding apparatus according to claim 3, wherein said coding unit includes:

a bit number calculating unit operable to calculate a number of bits of the replaced codes in every digital signal consisting of a predetermined number of samples; and a judging unit operable to judge whether or not the calculated number of bits is a target number of bits or less, and said coding unit refers to the first codebook in a case where the number of bits of the codes which have been replaced with reference to the first codebook is the target number of bits or less, and refers to the one selected second codebook selected by said selecting unit in a case where the number of bits of the codes which have been replaced with reference to the first codebook is larger than the target number of bits.

5. The coding apparatus according to claim 4, wherein the selecting unit selects, out of the plurality of second codebooks, one codebook including a largest number of M1, M2, ..., Mm of codes under a condition that a number of bits of the codes in the one codebook does not exceed the target number of bits.

6. The coding apparatus according to claim 2, wherein said coding unit includes:

a bit number calculating unit operable to calculate a number of bits of the replaced codes in every digital signal consisting of a predetermined number of samples; and a judging unit operable to judge whether or not the calculated number of bits is a target number of bits or less, and said coding unit refers to the first codebook in a case where the number of bits of the codes which have been replaced with reference to the first codebook is the target number of bits or less, and refers to a second codebook selected by said selecting unit in a case where the number of bits of the codes which have been replaced with reference to the first codebook is larger than the target number of bits.

7. The coding apparatus according to claim 6, wherein said selecting unit selects one codebook out of the at least one second codebook, the one codebook including a largest number of M1, M2, ..., Mm of codes under a condition that a number of bits of the codes in the one codebook does not exceed the target number of bits.

8. A coding method for coding a digital signal with reference to a codebook out of a first codebook and at least one second codebook which are held in a holding unit, comprising:

a scaling step of scaling inputted signal values so that the signal values fall within a predetermined range of values including N, N is a natural number, consecutive integers;

a quantizing step of quantizing the scaled signal values respectively into digital signal values within a range of values of the N integers;

a coding step of replacing a digital signal with codes with reference to either the first codebook or the at least one second codebook held in the holding unit, corresponding to a set of the quantized digital signal values quantized by said quantizing step; and a selecting step of selecting another codebook, which said coding step is to refer to, of different quantization resolution, from among either the first codebook or the at least one second codebook depending on a set of the quantized signal values quantized by said quantizing step wherein the first codebook shows one-to-one correspondence between N codes and the N integers, said at least one second codebook shows one-to-one correspondence between M, M is a natural number less than N, codes and M integers which are a subset of the N integers, the a least one second codebook having quantization resolution lower than quantization resolution of the first codebook, and in said coding step, even when switching the codebook being referred to based on the codebook selected by said selecting step, the codebook is referred to using the same integer values which are indicated by the quantized digital signal quantized by said quantization step, and the integer values are replaced which are indicated by the quantized digital signal with codes with reference to the selected codebook.

9. The coding method according to claim 8, wherein when the holding unit holds a plurality of second codebooks, the plurality of second codebooks respectively show one-to-one correspondence between M1, M2, ..., Mm, M1, M2, ..., Mm are natural numbers, codes and M1, M2, ..., Mm integers, the M1, M2, ..., Mm being different numbers from each other, and the M1, M2, ..., Mm integers including a set of integers that is common to all the second codebooks, m being different for each of said second codebooks.

10. The coding method according to claim 9, wherein, when selecting a codebook other than the first codebook in said selecting step, an average value and a distribution of the digital signal values are calculated, the set of the quantized signal values is examined, and one second codebook is selected based on a result of the examination.

11. The coding method according to claim 10, wherein said coding step includes:

a bit number calculating step of calculating a number of bits of the replaced codes in every digital signal consisting of a predetermined number of samples; and a judging step of judging whether or not the calculated number of bits is a target number of bits or less, and in said coding step, the first codebook is referred to. in a case where the number of bits of the codes which have been replaced with reference to the first codebook is the target number of bits or less, and one codebook out of the selected second codebook selected by said selection step is referred to in a case where the number of bits of the codes which have been replaced with reference to the first codebook is larger than the target number of bits.

12. The coding method according to claim 11, wherein in the selecting step, one codebook is selected out of the plurality of second codebooks, the one codebook including a largest number of $M_1, M_2, \ldots, M_m$ of codes under a condition that a number of bits of the codes in the one codebook does not exceed the target number of bits.

13. The coding method according to claim 9, wherein said coding step includes:

a bit number calculating step of calculating a number of bits of the replaced codes in every digital signal consisting of a predetermined number of samples; and a judging step of judging whether or not the calculated number of bits is a target number of bits or less, and in said coding step, the first codebook is referred to in a case where the number of bits of the codes which have been replaced with reference to the first codebook is the target number of bits or less, and a second codebook selected by said selecting step is referred to in a case where the number of bits of the codes which have been replaced with reference to the first codebook is larger than the target number of bits.

14. The coding method according to claim 13, wherein in said selecting step, one codebook is selected out of the at least one second codebook, the one codebook including a largest number of $M_1, M_2, \ldots, M_m$ of codes under a condition that a number of bits of said codes in said one codebook does not exceed the target number of bits.

* * * * *